United States Patent [19]

Mori

[11] Patent Number: 5,024,970

[45] Date of Patent: Jun. 18, 1991

[54] METHOD OF OBTAINING SEMICONDUCTOR CHIPS

[75] Inventor: Masataka Mori, Fukuoka, Japan

[73] Assignee: Mitsubishi Denki Kabushiki Kaisha, Tokyo, Japan

[21] Appl. No.: 446,125

[22] Filed: Dec. 5, 1989

[30] Foreign Application Priority Data

Jun. 27, 1989 [JP] Japan .................. 1-164720

[51] Int. Cl.⁵ .......................... H01L 21/302
[52] U.S. Cl. .................. 437/226; 437/227; 437/228; 148/DIG. 28
[58] Field of Search ............ 437/226, 227, 228; 148/DIG. 28

[56] References Cited

FOREIGN PATENT DOCUMENTS

| 0115343 | 9/1980 | Japan | 437/227 |
| 0103447 | 8/1981 | Japan | 437/227 |
| 0197743 | 11/1983 | Japan | 437/226 |
| 0253241 | 12/1985 | Japan | 437/226 |
| 0026839 | 2/1987 | Japan | 437/226 |
| 0226940 | 9/1988 | Japan | 437/226 |
| 0196850 | 8/1989 | Japan | 437/227 |

Primary Examiner—Brian E. Hearn
Assistant Examiner—Trung Dang
Attorney, Agent, or Firm—Oblon, Spivak, McClelland, Maier & Neustadt

[57] ABSTRACT

An insulating strip layer is provided in the middle portion of an isolating zone which isolates electronic element regions from each other. A platinum layer is formed and sintered, whereby platinum silicide layers are obtained between the insulating strip layer and the electronic element regions. A silicon nitride film is formed and etched by plasma. The plasma etches the silicon nitride film and selectively etches the wafer through the gaps between the platinum silicide layers and layers adjacent thereto whereby grooves are obtained in the isolating zone. A crack which may be caused in the cutting or dicing process is stopped at the grooves.

9 Claims, 10 Drawing Sheets 5,024,970

METHOD OF OBTAINING SEMICONDUCTOR CHIPS

BACKGROUND OF THE INVENTION

1. Field of the Invention

The present invention relates to a semiconductor chip and a method of obtaining the same and, more specifically, it relates to improvement for preventing a semiconductor chip from cracking to the inside of a electronic element region in the semiconductor chip in cutting a semiconductor wafer into semiconductor chips by dicing.

2. DESCRIPTION OF THE PRIOR ART

As well-known in the field of manufacturing a semiconductor device, a semiconductor wafer in which an array of electronic element regions are fabricated is subjected to a dicing process so that the semiconductor wafer is cut into a plurality of semiconductor chips each of which has an electronic element region. FIG. 6A is a partial sectional view showing a semiconductor wafer in which an array of electronic element regions 20 is fabricated on one of a major surfaces of a semiconductor substrate 1, and this figure corresponds to a sectional view taken along line 6A—6A of FIG. 7A which is a partial plan view of the semiconductor wafer. Each of the electronic element regions 20 includes an active region 2 having at least one electronic element and a silicon oxide film 4 covering the active region 2. The word "active region" is herein used as a general term for a construction related to the operation of the electronic element, and it may includes a pn junction construction, a MOS construction and/or other various constructions. In the drawings, without discriminating between these elements, they are represented as the active region 2.

A silicon nitride film 10 is formed as a passivation film on the top surface of each of the silicon oxide films 4. Further, an isolating zone or a dicing line (street line) 5 is provided between adjacent silicon oxide films 4 to isolate the electronic element regions 20 from each other and define a space for dicing.

As illustrated in a partial plan view of FIG. 7B showing the semiconductor wafer and in a sectional view of FIG. 6B taken along line 6B—6B of FIG. 7B, the dicing process inCludes a step of forming a cutting groove 14 along the dicing line 5 in the semiconductor substrate 1. The semiconductor wafer is then cut into a plurality of semiconductor chips at the groove 5 such that the electronic element regions 20 ar assigned to the plurality of chips, respectively.

As methods of attaining such a dicing, a mechanical dicing method using a rotational blade or a diamond scriber and a non-mechanical dicing method using a laser scriber or the like are known. Especially, in the mechanical dicing method, since mechanical vibration and cutting stress are applied to the semiconductor wafer, a crack 50 extending from the cutting groove 14 to the electronic element region 20 is often caused in the semiconductor substrate 1. If the crack 50 reaches the active region 2, the semiconductor chip might be thrown away as a defective chip. As a result, the yield in the dicing process can hardly be improved, which leads to increase in cost of the semiconductor chips and accordingly in cost of the resultant semiconductor devices having the semiconductor chips. The crack may also detract from the reliability of the semiconductor device.

SUMMARY OF THE INVENTION

The present invention is directed to a semiconductor chip which is obtained by cutting a semiconductor wafer having an array of electronic element regions.

According to the present invention, the semiconductor chip comprises: (a) a semiconductor substrate having a major surface on which at least one groove ring is formed; and (b) an electronic element region having at least one electronic element and formed in a part of the major surface of the semiconductor substrate which is enclosed by the at least one groove ring.

Preferably, the major surface has a closed contour, and the at least one groove ring is formed along the closed contour.

Even if the semiconductor chip cracks from the cut portion in cutting the semiconductor wafer into those semiconductor chips, the crack stops at the groove ring, so that the crack hardly reaches the inside of the electronic element region.

The present invention is also directed to a method of obtaining semiconductor chips by cutting a semiconductor wafer in which a plurality of electronic element regions are provided.

According to the present invention, the method comprises the steps of: (a) forming first and second electronic element regions on a major surface of a semiconductor wafer such that the first and second electronic element regions are isolated from each other across an isolating zone on the major surface, wherein the isolating zone extends in a first direction perpendicular to an alignment direction of the first and second electronic element regions; (b) forming N grooves in the isolating zone in parallel to the first direction, wherein (N−1) intergroove spaces intervene between the N grooves and N is an integer larger than one; and (c) cutting the semiconductor wafer along a cutting line which is set on one of the (N−1) intergroove spaces and extends in the first direction to thereby obtain semiconductor chips each having an electronic element region.

Since the semiconductor wafer is cut at the position between the grooves formed in the isolating zone of the electronic element regions, the extension of the crack can be stopped at one of the grooves.

Preferably, the integer N is four, and therefore, four grooves are formed in the isolating zone.

In a preferred embodiment of the present invention, the grooves are formed by selectively etching the semiconductor wafer while employing metal-semiconductor composite layers as a mask. The metal-semiconductor composite layers may be formed through thermal reaction between the semiconductor wafer and a metal layer provided thereon.

In an aspect of the present invention, an insulating layer is formed in the isolating zone. The four grooves are separately formed in respective sides of the insulating layer. The cutting line is defined on the insulating layer and the semiconductor wafer is cut into chips at the cutting line.

Accordingly, it is an object of the present invention to provide a semiconductor chip obtained by cutting a semiconductor wafer, which can avoid making a crack extending to the inside of an electronic element region and which has an enhanced yield and reliability.

It is another object of the present invention to provide a method of obtaining a semiconductor chip, by which occurrence of a crack extending to the inside of an electronic element region can be avoided when a semiconductor wafer is out into chips.

It is still another object of the present invention to provide a method of attaining the above objects without a complicated process.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a plan view of a semiconductor chip obtained through the preferred embodiment;

DESCRIPTION OF THE PREFERRED EMBODIMENTS

Figure 1A:
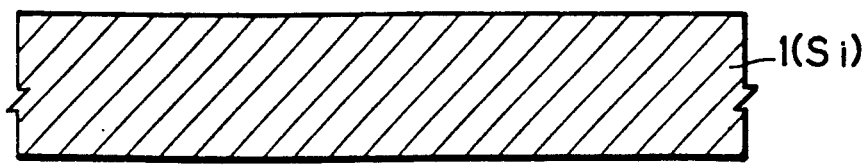
FIGS. 1A to 1L are partial sectional views illustrating a semiconductor wafer according to a preferred embodiment of the present invention.
Figure 1B:
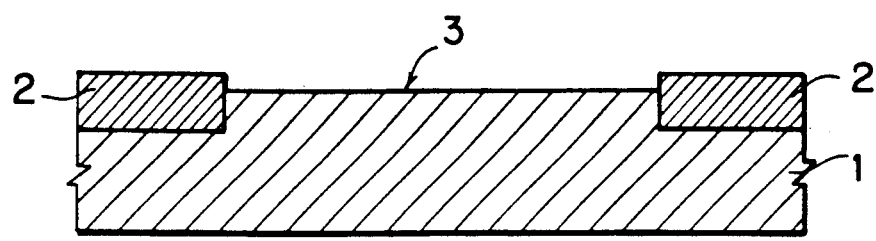
Figure 6A:
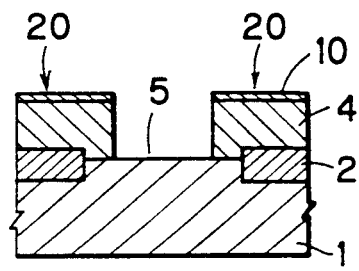
FIGS. 6A and 6B are partial sectional views of a semiconductor wafer illustrating a conventional method.
Figure 7B:
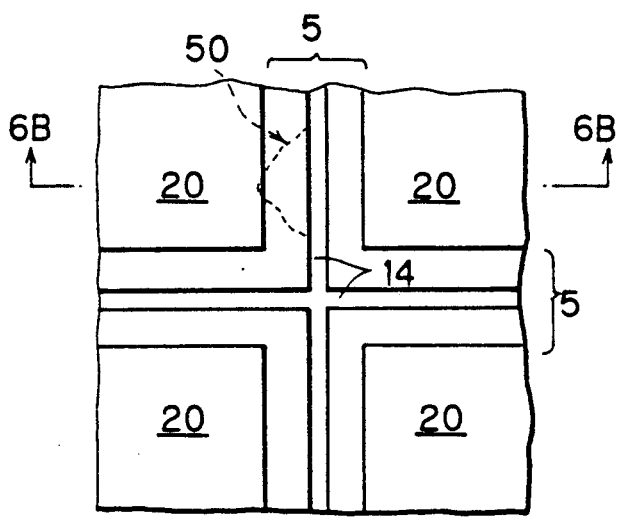
Figure 6B:
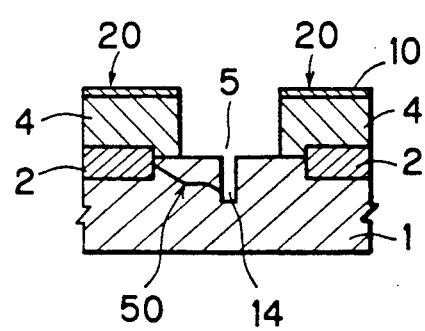

FIGS. 1A–1L are partial sectional views illustrating process steps in a method of obtaining a semiconductor chip according to a preferred embodiment of the present invention. As shown in FIG. 1A, a silicon substrate 1 in the form of a wafer is first prepared. Then, as shown in FIG. 1B, a plurality of active regions 2 are fabricated on one of major surfaces of the silicon substrate 1. Each of the active regions 2 includes at least one electronic element, and the inner construction of the active region 2 is omitted in the figures, similar to FIG. 6A presented in conjunction with the prior art. Although not shown in FIG. 1B, the active regions 2 are disposed in the form of a matrix or an array on the silicon substrate 1. Further, an area 3 is defined between the adjacent active regions 2, isolating them from each other.

Referring to FIG. silicon oxide films 4a are then formed to individually cover each of the active regions 2. The silicon oxide films 4a have a thickness of 3000–3500 Å, for example. Each of the active regions 2 is allocated to each of electronic element regions 20, so that the lateral size of each of the silicon oxide films 4a defines the lateral size of each of the electronic element regions 20. Furthermore, an isolating zone 5 is defined with a prescribed width between the adjacent electronic element regions 20.

Figure 1C:
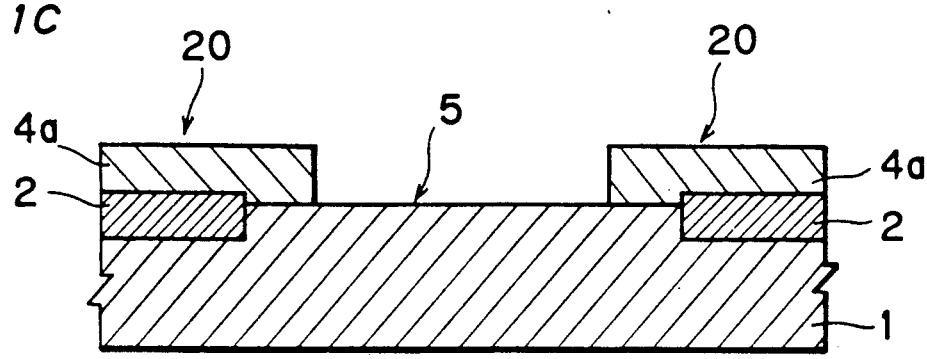
Figure 1D:
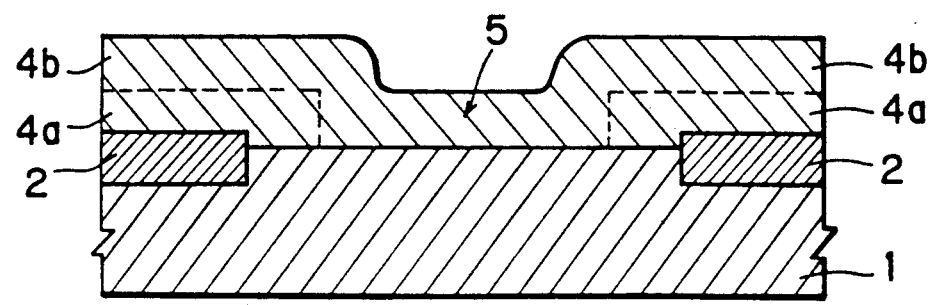
Figure 1E:
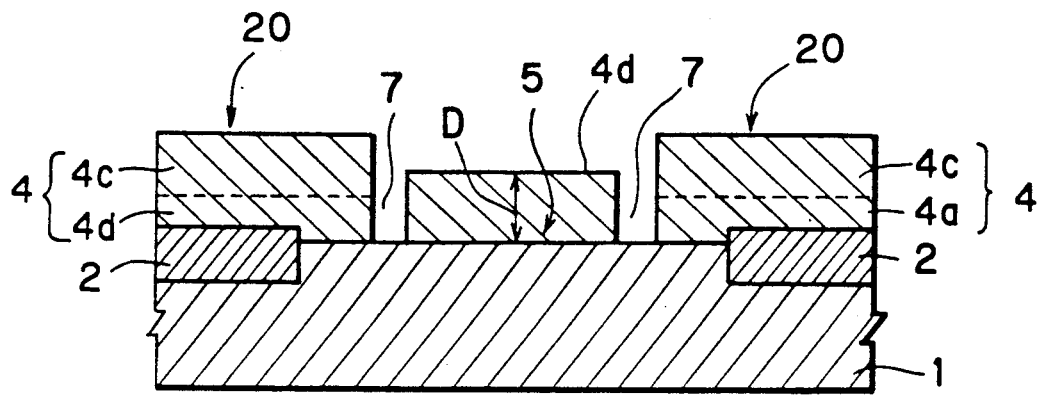
Figure 1F:
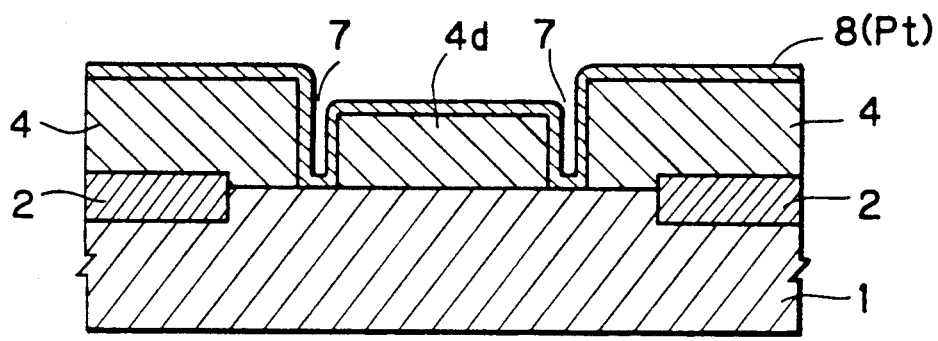
Figure 1G:
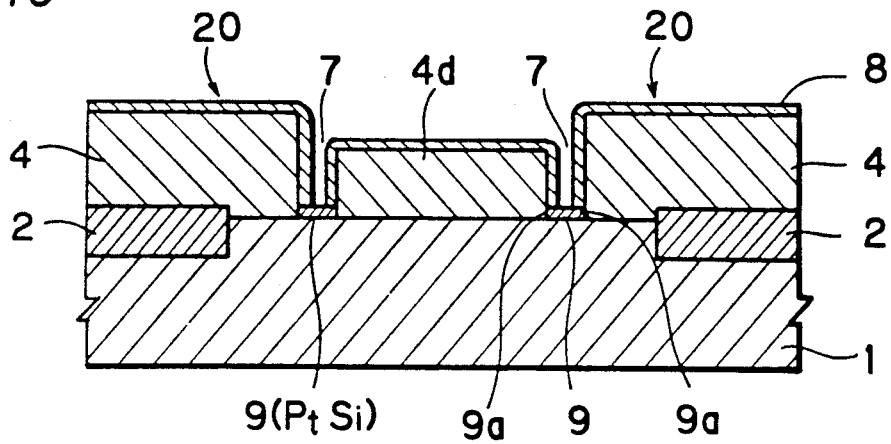
Figure 1H:
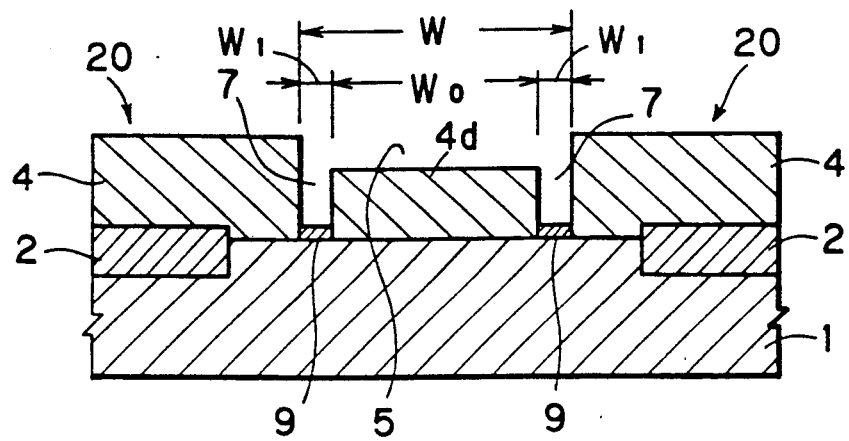
Figure 1I:
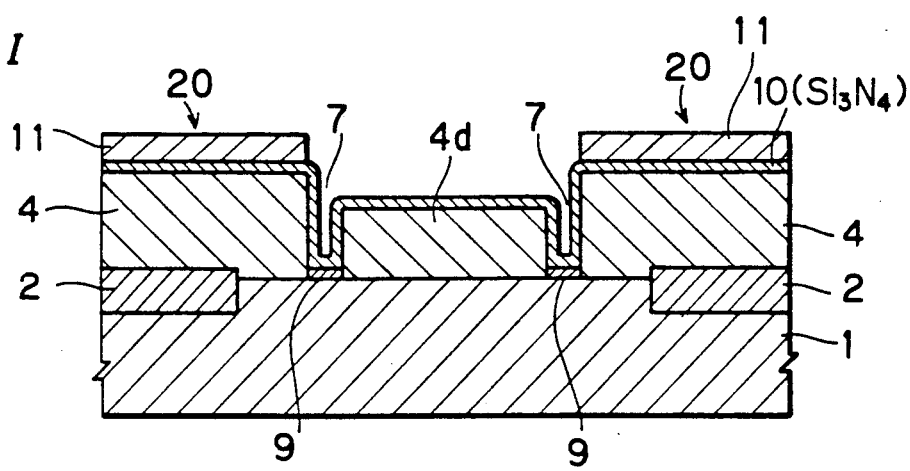
Figure 1J:
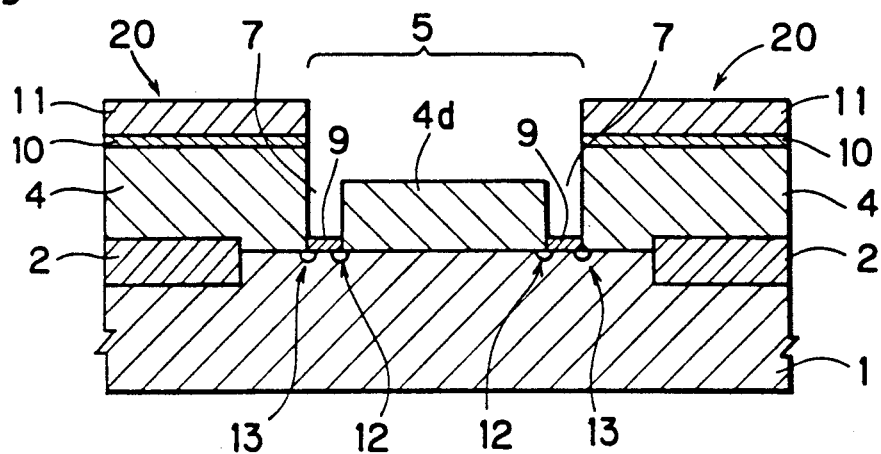
Figure 1K:
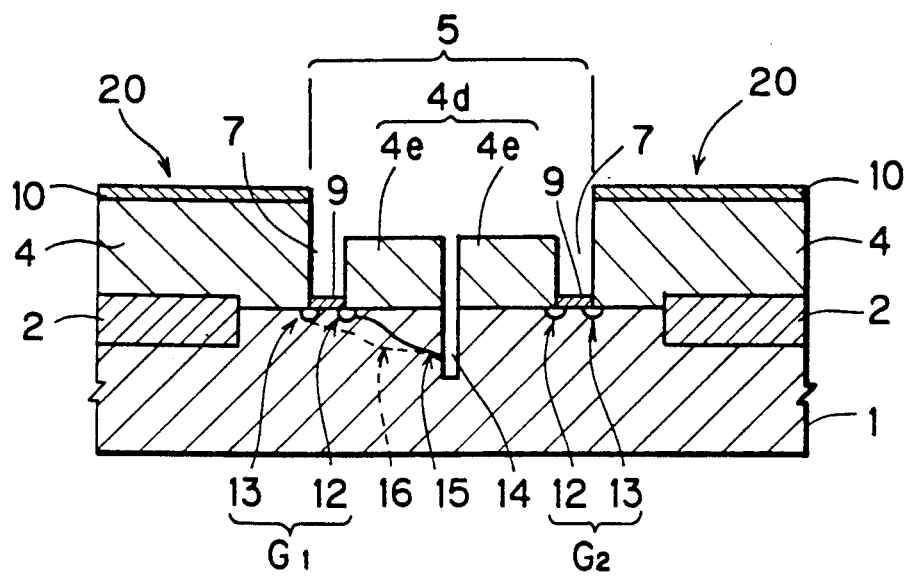
Figure 1L:
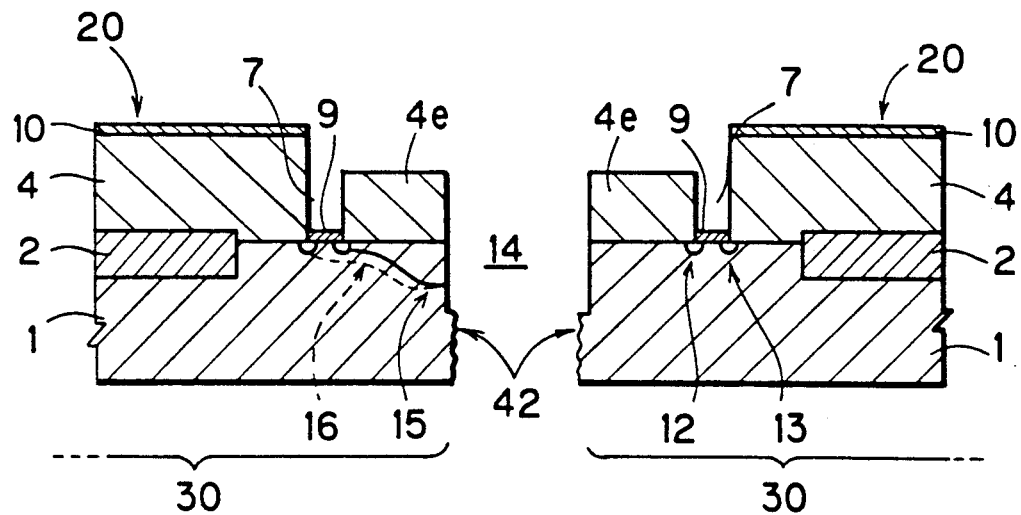
Figure 2A:
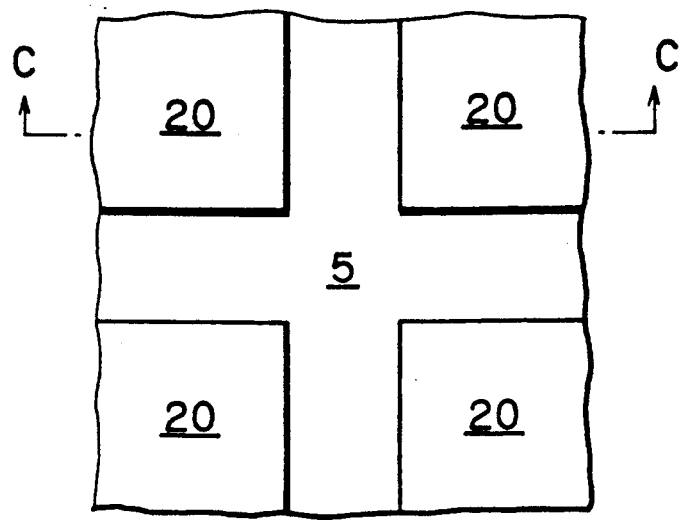
FIGS. 2A to 2F are partial plan views illustrating respective process steps in the preferred embodiment.

FIG. 2A is a plan view corresponding to FIG. 1C, which is a sectional view taken along line C—C of FIG. 2A. Corelated to the matrix arrangement of the electronic element regions 20, the isolating zone 5 is defined in a lattice. The isolating zone 5 will be used as a dicing line in a dicing step. After that, a silicon oxide film 4b is deposited over the entire surface of the silicon substrate 1 by means of CVD (FIG. 1D). The silicon oxide film 4b has a thickness of 4000–4500 Å, for example. Then, the silicon oxide film 4b is selectively removed by photolithography (FIG. 1E) to leave a silicon oxide film 4d in the middle of the isolating zone 5 and a silicon oxide film 4c in each of the electronic element regions 20. The silicon oxide films 4a and 4c are made of the same material, so that these films make as a whole a silicon oxide film 4 having a thickness of 7000–8000 Å. Hence, in FIGS. 1F to 1L and FIGS. 3A and 3B presented in conjunction with later description, the boundary between the silicon oxide films 4a and 4c is not shown. The silicon oxide film 4d which is left in the middle of the isolating zone 5 has a thickness D of 4000–4500 Å.

Figure 2B:
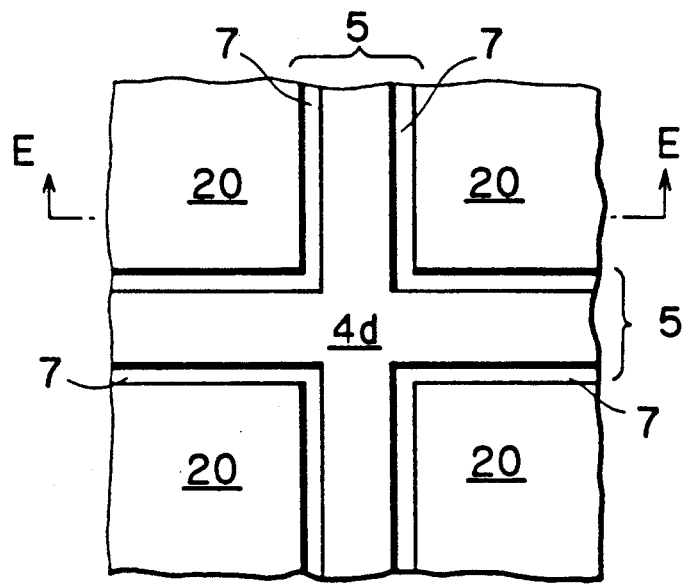

FIG. 2B is a plan view corresponding to FIG. 1E which is taken along line E—E of FIG. 2B. The silicon oxide film 4d having a shape of a strip is formed only in the middle portion of the isolating zone 5 and extends along the isolating zone 5. Therefore, as can be seen from FIG. 1E, a gap space 7 is defined between the adjacent silicon oxide films 4d and 4.

At the next step (FIG. 1F), a platinum film 8 is formed over the entire surface of the silicon substrate 1 through a sputtering technique. The formation of the platinum film 8 may be done in conjunction with a step of wiring the electronic element regions 20. It should be noted that the platinum film 8 covers the respective walls and bottoms of the gap spaces 7. The wafer shown in FIG. 1F is then put in a furnace and heated for a predetermined period of time for sintering platinum. As a result, as shown in FIG. 1G, a part of the platinum film 8 in the respective bottom areas of the gap spaces 7 receives silicon atoms diffused from the silicon substrate 1 and becomes platinum silicide films 9. The remaining part of the platinum film 8 is in contact with the silicon oxide films 4d or 4 and remains unchanged because no reaction is caused by heat between platinum and silicon oxide. A thin layer of platinum (not shown in FIG. 1G) is left on opposite sides 9a of the platinum silicide film 9. This is because the opposite sides 9a are not in contact with the silicon substrate 1, and therefore no reaction between silicon and platinum is substantially caused.

Figure 3A:
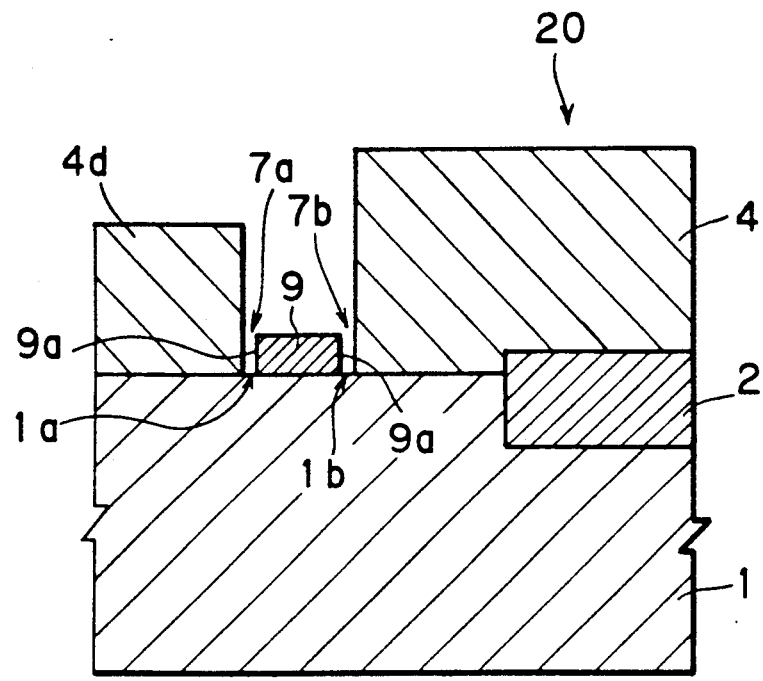
FIGS. 3A and 3B are enlarged views corresponding to FIGS. 1H and 1J, respectively.

Then, the wafer shown in FIG. 1G is soaked in aqua regia to remove the platinum film 8. Further, an aluminum wiring (not shown) is provided on each of the electronic element regions 20. FIG. 1H shows a cross section of the wafer subjected to the process including these steps, and FIG. 3A is an enlarged view of a part of FIG. 1H. In FIG. 1H, the isolating zone 5 (i.e., the dicing line) has a width W of approximately 60 $\mu$m, the silicon oxide film 4d has a width $W_0$ of approximately 50 $\mu$m, and each of the gap spaces 7 has a width $W_1$ of approximately 5 $\mu$m. The platinum between the opposite sides 9a of the platinum silicide film 9 and the silicon oxide films 4d, 4 is removed with the aqua regia to form gaps 7a and 7b between the platinum silicide film 9 and the silicon oxide films 4d, 4. The bottom faces of the gaps 7a and 7b (FIG. 3A) are exposed surfaces 1a and 1b of the silicon substrate 1, respectively.

At the next step (FIG. 1I), a silicon nitride film 10 is formed as a passivation film over the entire surface of the silicon substrate 1 through a plasma CVD technique. Then, a resist film 11 is formed to cover the silicon nitride film 10 on the silicon oxide film 4. After that, the nitride silicon film 10 is selectively removed by plasma etching with a gas containing $CF_4$ 14 $O_2$.

Figure 3B:
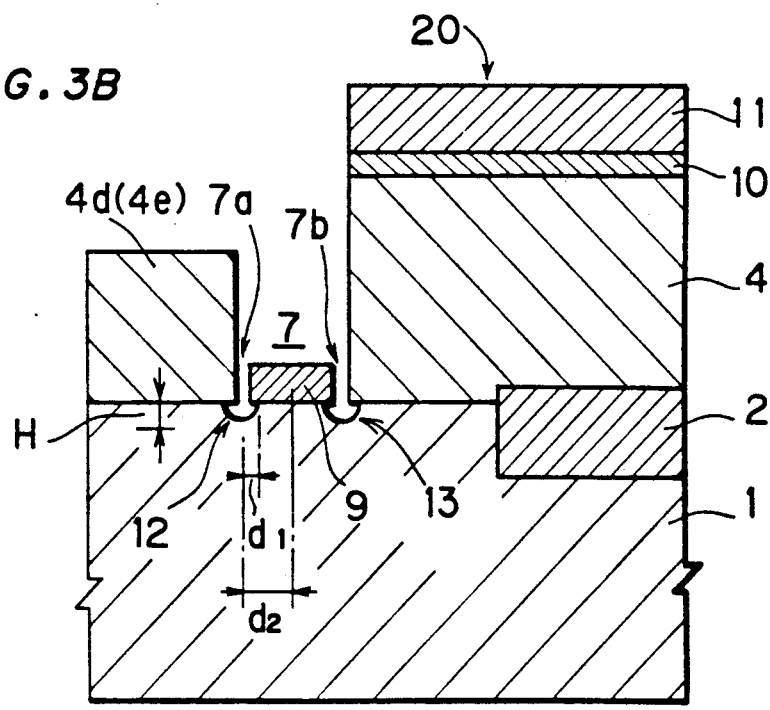

It should be noted that the etching time in this removing process is about 10% (e.g., about 30 seconds to 1 minute) longer than a period necessary for completely removing the nitride silicon film not covered with the resist film 11. Accordingly, a gas plasma goes through the gap 7a, 7b to the exposed surface 1a, 1b of the silicon substrate 1 (FIG. 3A), and therefore, respective parts of the silicon substrate 1 below the exposed surfaces 1a and 1b are etched away. As a result, as shown in FIG. 1J and FIG. 3B, cavities 12 and 13 are formed under the gaps 7a and 7b. In the formation of the cavities 12 and 13, the platinum silicide film 9 serves as a mask. Preferably, the cavities 12 and 13 have commonly a depth of H (FIG. 3B) of approximately 1 μm.

Meanwhile, an undercut in the etching allows the cavities 12 and 13 to extend laterally, and the respective cross width of the cavities 12 and 13 becomes larger than that of the gaps 7a and 7b, respectively. As a result, each of the cavities 12 and 13 has a cross section which is nearly an arc of a circle or ellipse, and hence the lateral length of each of the cavities 12 and 13 becomes longer as the depth H becomes deeper. To prevent these cavities 12 and 13 from coming in contact with each other, it is necessary that a length $d_1$ corresponding to $\frac{1}{2}$ of the lateral length of each of the cavities 12 and 13 (i.e., the length in a direction parallel to the major surface of the silicon substrate 1) is smaller than a length $d_2$ corresponding to $\frac{1}{2}$ of the lateral length of the platinum silicide film 9. The period of etching is determined such that the length $d_1$ is about 2.5 μm or below when the lateral length $W_1$ of the platinum silicide film 9 (FIG. 1H) is about 5 μm. The above mentioned value 1 μm for the depth H is suitable for preventing a crack of the wafer from extending to the active region 2 in the following dicing process under the condition where the cavities 12 and 13 are isolated from each other.

Figure 2C:
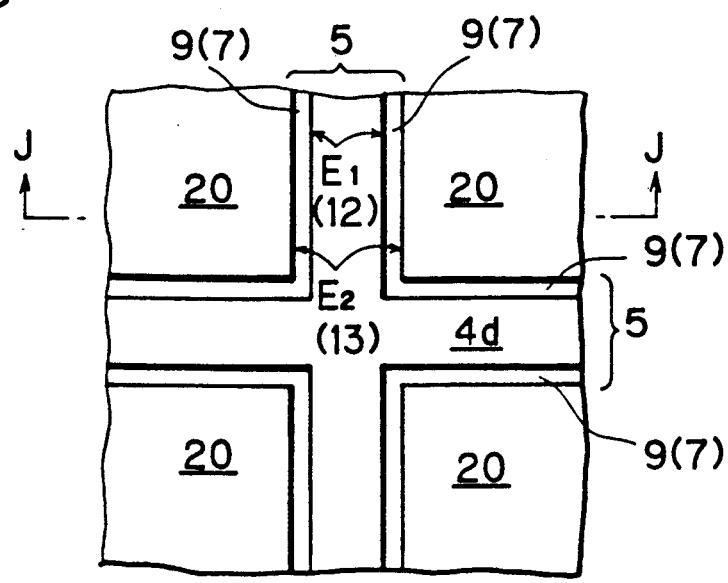
Figure 2D:
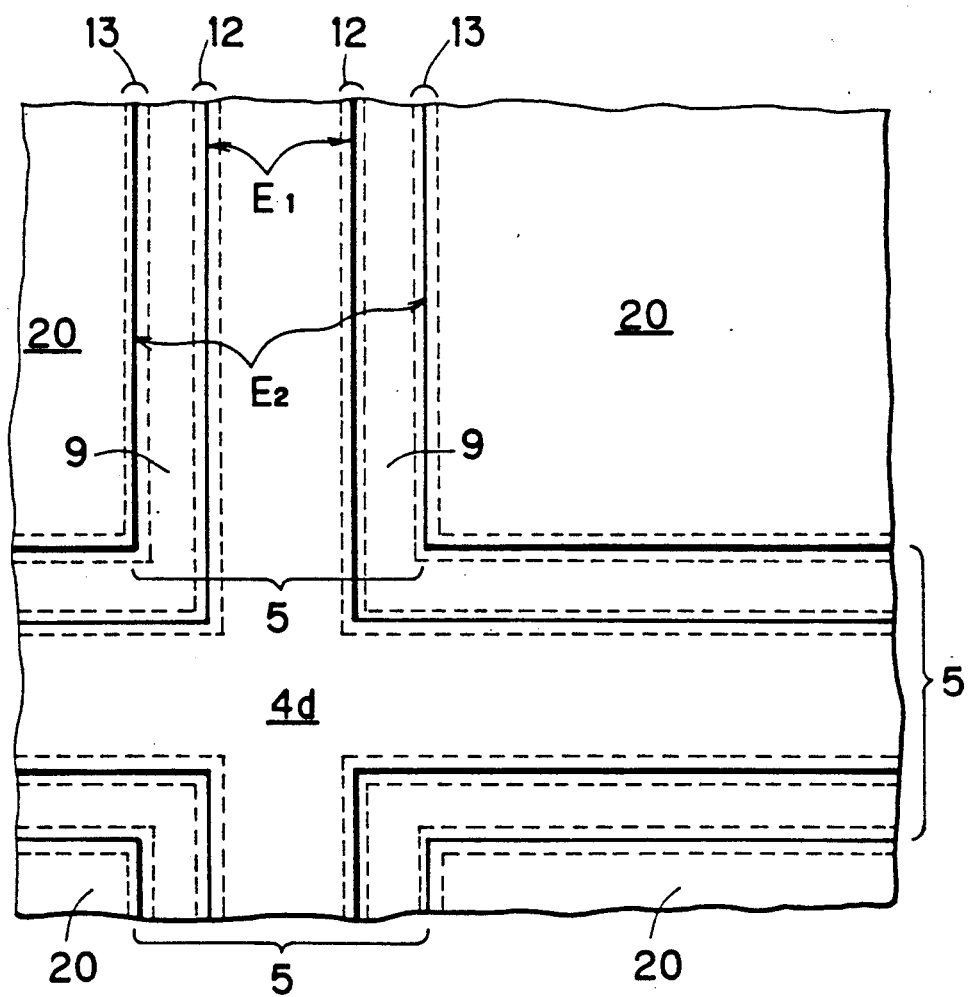

As can be seen from FIG. 3B, each of the cavities 12 and 13 is not a closed cavity but a groove having an opening which communicates with corresponding one of the gap spaces 7a and 7b. The resist film 11 is removed after the etching process. In FIG. 2C which is a plan view corresponding to FIG. 1J, the cavities 12 and 13 are not depicted for convenience of illustration. In FIG. 2D which is an enlarged view of a part of FIG. 2C, each of the cavities 12 and 13 is shown by broken lines with the opposite edges $E_1$ and $E_2$ of the platinum silicide film 9 positioned in the middle of each cavity. A sectional view about line J—J of FIG. 2C corresponds to FIG. 1J.

As can be seen from FIG. 2D, four cavities are located between the electronic element regions 20 adjacent to each other, that is, there are two of the cavities 12 and two of the cavities 13. Namely, assuming that the number of the cavities or grooves provided between the electronic element regions 20 adjacent to each other is N, the preferred embodiment corresponds to the case where N=4. Further, each of the cavities 12 and 13 extends enclosing each of the electronic element regions 20.

FIG. 1K shows the dicing process. In the upper middle portion of the silicon oxide film 4d, an imaginary cutting line (not shown) is set in the longitudinal direction of the isolating zone or trench 5 (i.e., in the direction orthogonal to the sheet of FIG. 1K), and a cutting groove 14 is formed along the imaginary cutting line. The cutting groove 14 has a depth corresponding to about a half of the thickness of the silicon substrate 1, for example, and is formed with a blade scriber. The silicon oxide film 4d is divided into a pair of silicon oxide films 4e through the formation of the cutting groove 14. In this dicing process, a crack 15 originating in the cutting groove 14 may be caused in the silicon substrate 1. However, in most cases, the crack 15 tends to the cavity 12 and stops at the same. As a result, the crack hardly reaches the inside of the electronic element region 20, especially the active region 2. Even if the extension of the crack can not be stopped at the cavity 12, the crack stops at the cavity 13 as indicated with a crack 16 of a broken line in FIG. 1K.

Among these cavities 12 and 13, the cavity 12 is especially important in that it is positioned closer to the cutting groove 14. In other words, the cavity 12 is positioned with a relatively longer distance from the active region 2, so that it allows a crack to stop at a position relatively far from the active region 2.

The four cavities 12 and 13 which are provided between the adjacent two electronic element regions 20 are disposed with three spaces intervening between two of them, that is, a first space between the cavities 12 and 13 on the left side of FIG. 1K, a second space between the two cavities 12 and a third space between the cavities 12 and 13 on the right side of FIG. 1K. The cutting groove 14 is provided at the space between the cavities, or the second space, and therefore the cutting groove 14 serves as a boundary for classifying the four cavities 12 and 13 into a first cavity group $G_1$ on the left side of FIG. 1K and a second cavity group $G_2$ on the right side of FIG. 1K. Generally, N cavities or grooves are disposed with (N−1) spaces intervening between two of the cavities, where N is an integer larger than one, and one of these intervening spaces includes a cutting groove. As a result, assuming that $N_1$ and $N_2$ are positive integers satisfying the following equation:

$$N_1 + N_2 = N \tag{1}$$

the N cavities are classified into $N_1$ cavities located on the side of one electronic element region and $N_2$ cavities located on the side of the other electronic element region.

Basic requirements for satisfying the principle of the present invention are as follows:

$$N \geq 2,\ N_1 \geq 1,\ N_2 \geq 1 \tag{2}$$

Preferably, N, $N_1$ and $N_2$ are determined so as to satisfy the following formulae:

$$N \geq 4,\ N_1 \geq 2,\ N_2 \geq 2 \tag{3}$$

In an example shown in FIG. 1K, the following formulae are satisfied:

$$N = 4,\ N_1 = N_2 = 2 \tag{4}$$

Figure 2E:
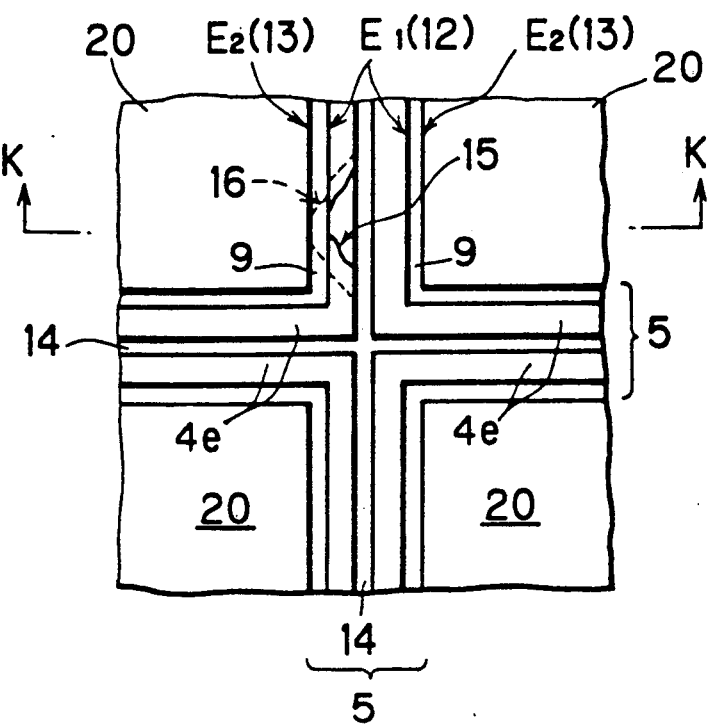

FIG. 2E is a plan view corresponding to FIG. 1K. Referring to FIG. 2E, the cavities 12 and 13 are not shown explicitly, but are implicitly shown by the same lines illustrating the opposite edges $E_1$ and $E_2$ of the platinum silicide film 9, for convenience of illustration. A sectional view along line K—K of FIG. 2E corresponds to FIG. 1K.

Figure 4:
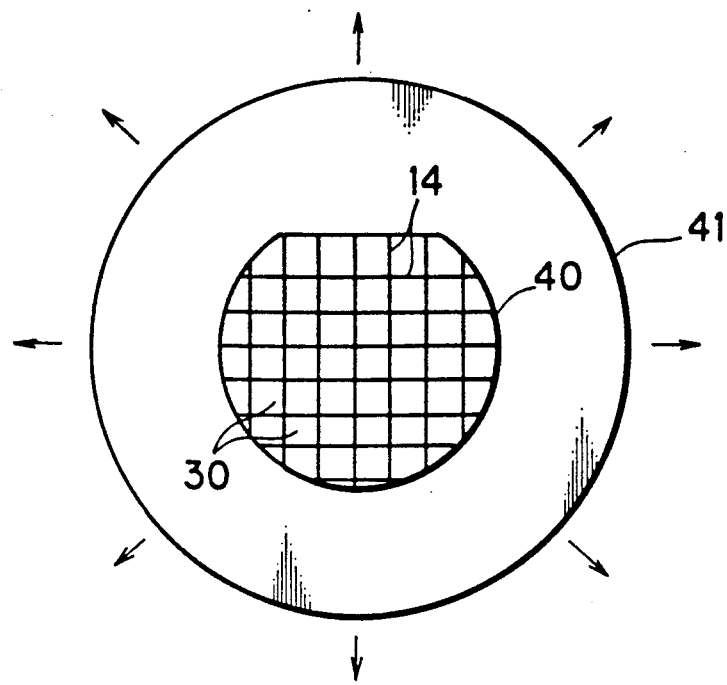
FIG. 4 is a plane view of the wafer showing a break-expand process.

The wafer shown in FIGS. 1K and 2E is shown as a wafer 40 in FIG. 4. A vinyl sheet 41 is adhered to the back surface of the wafer 40, and the vinyl sheet 41 is pulled in radial directions as shown with arrows in FIG. 4. Accordingly, the vinyl sheet 41 is stretched radially, so that the wafer 40 is divided at the cutting grooves 14 into semiconductor chips 30 ("break-expand process").

Figure 2F:
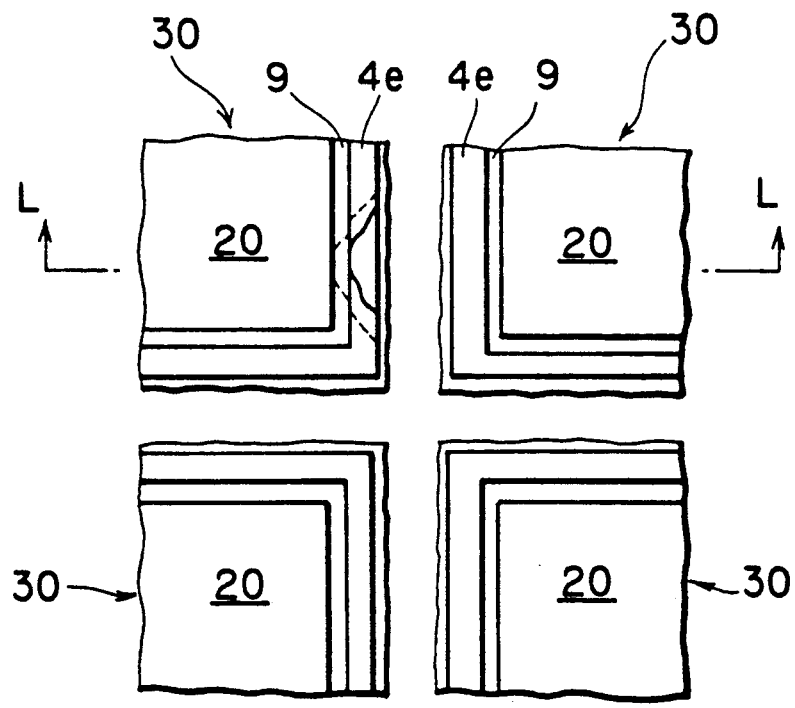

FIG. 2F is a partial plan view of the wafer in the break-expand process, and a sectional view along line L—L of FIG. 2F is shown in FIG. 1L. Break faces 42

(FIG. 1L) extend from the bottom surface of the cutting groove 14 to the under surface of the silicon substrate 1, whereby the semiconductor chips 30 each of which includes one of the electronic element region 20 can be obtained. Even if the crack 15 or 16 is caused, the crack 15 or 16 does not reach the active region 2, and these semiconductor chips 30 do not have to be thrown away as defective chips. Consequently, the yield in manufacturing the semiconductor chips 30 and reliability in electrical characteristic of the semiconductor chips 30 are improved.

Further, since the cutting groove 14 is provided not in the platinum silicide film 9 but in the silicon oxide film 4d, it is substantially avoided that fragments of platinum silicide produced by cutting in the dicing process are adhered to the semiconductor chips 30 and deteriorate the electrical characteristic of semiconductor chips 30. Even if the fragments produced by cutting the silicon oxide film 4d are adhered to the semiconductor chips 30, they do not deteriorate the electrical characteristic of the chips 30 because they are insulators.

Figure 5:
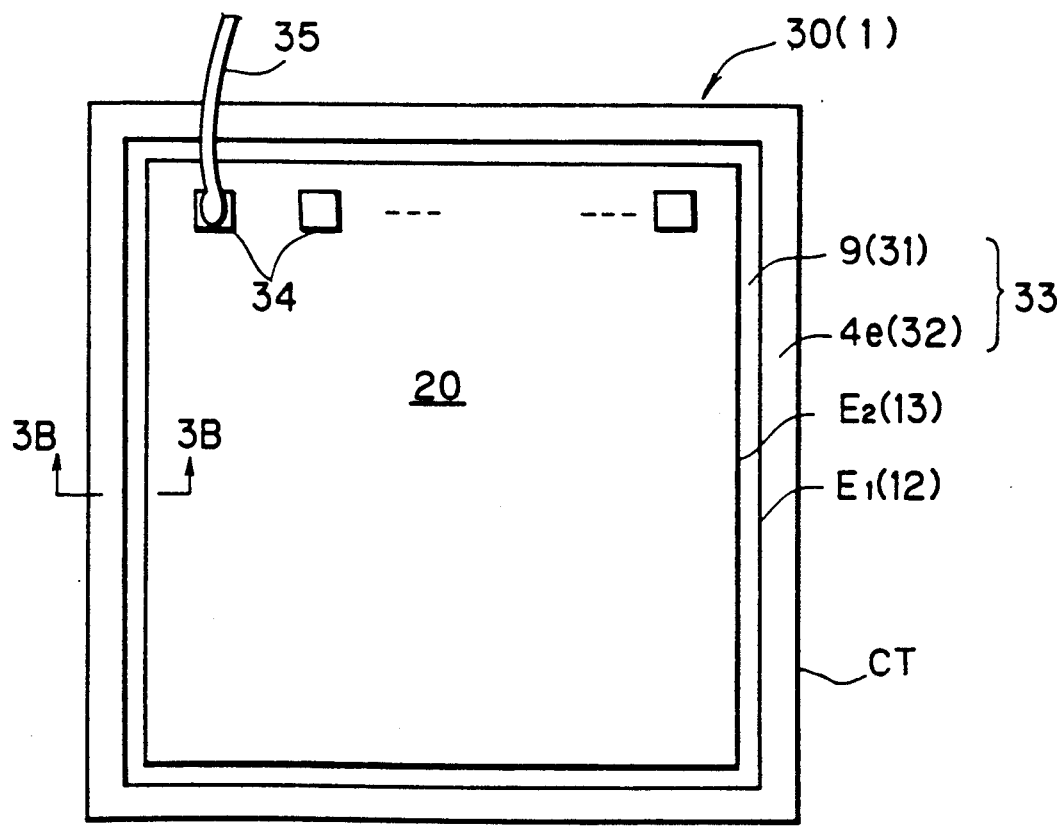
Figure 7A:
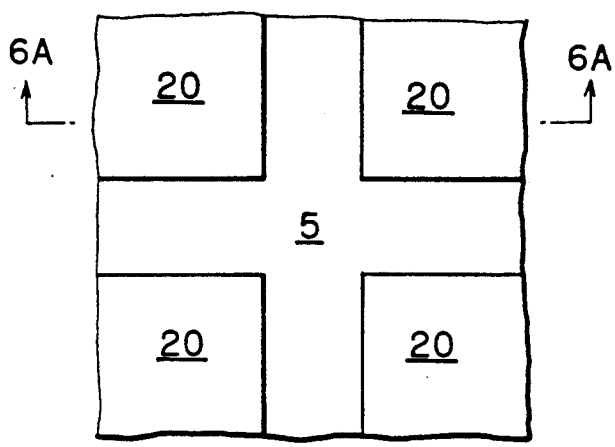
FIGS. 7A and 7B are partial plan views corresponding to FIGS. 6A and 6B, respectively.

The semiconductor chips 30 thus obtained are subjected to a bonding process, a packaging process and the like, whereby semiconductor devices are obtained. FIG. 5 is a plan view of one of the semiconductor chips 30 in the bonding process. A required number of bonding pads 34 are provided in an end portion of the electronic element region 20 and external wirings 35 are connected to those bonding pads 34. In FIG. 5, only a part of the bonding pads 34 and a part of external wirings 35 are shown. A sectional view along line 3B—3B of FIG. 5 substantially corresponds to FIG. 3B.

The construction of the semiconductor chip 30 in FIG. 5 is as follows: A rectangular insulation ring 32 of the silicon oxide film 4e lies on the outer margin 33 of the semiconductor chip 30 along the closed contour CT of the chip 30. A rectangular metal-semiconductor composite ring 31 made of platinum silicide further lies inside it. The cavities or groove rings 12 and 13 are located in the silicon substrate 1 at the positions corresponding to the opposite edges $E_1$ and $E_2$ of the metal-semiconductor composite ring 31 (the details of the cavities 12 and 13 are also omitted in FIG. 5). The electronic element region 20 is positioned in the center of the semiconductor substrate 1 and is enclosed by insulation ring 32, composite ring 31 and cavities 12 and 13.

The provision of the cavities 12 and 13 in the margin 33 prevents a crack from extending to the inside of the electronic element region 20 when the wafer is cut into the semiconductor chips 30. Accordingly, the semiconductor chip 30 of FIG. 5 can be manufactured with high yield, and the chip thus obtained has a high reliability. The process for forming the cavities 12 and 13 can be performed in corelation with the process for defining the electronic element region 20, so that there is little necessity of increasing the number of all steps for manufacturing the semiconductor device.

The present invention can be practiced with modification as follows. An arbitrary material layer resistant to etching may be used in place of the platinum silicide film 9, since the film 9 serves as a mask in the etching process for forming the cavities 12 and 13 and another kind of material can be used as long as it is resistant to the etching. For example, when a film of tungsten or molybdenum is used instead of the platinum film 8, a tungsten silicide film or a molybdenum silicide film is obtained instead of the platinum silicide film 9.

In accordance with the present invention, a construction of the inside of the electronic element region 20 is not limited, so that the present invention is applicable to both individual semiconductor elements and an integrated circuit.

As has been described, a semiconductor chip according to the present invention is provided with one or more grooves enclosing an electronic element region, so that a crack which is caused when a wafer is cut into semiconductor chips is prevented from extending to the inside of the electronic element region. Accordingly, the yield and reliability of the semiconductor chip are improved.

In the manufacturing method according to the present invention, a plurality of grooves are formed in an isolating zone of the electronic element region and then a semiconductor wafer is cut at the position between those grooves. Therefore, the crack can be stopped at the position of the groove in either of electronic element regions adjacent to each other with an isolating groove intervening. Accordingly, the yield and reliability of the semiconductor chip manufactured by this method are improved.

Further, in the preferred embodiment according to the present invention, the semiconductor wafer is etched using a mask resistant to etching provided in the isolating zone, and cavities obtained by the etching are used for the aforementioned grooves, so that positioning of the concave groove in the isolating zone is easy and no complicated process is required. Moreover, the semiconductor chip is not contaminated with fragments of the etching-resistant layer flying thereon due to the cutting.

The foregoing description of the preferred embodiment of the present invention has been presented for purposes of illustration and description. It is not intended to be exhaustive or to limit the invention to the precise form disclosed. Obviously, many other modifications and variations will be apparent to those skilled in this art. The scope of the invention can be defined by the claims appended hereto and their equivalents.

I claim:

1. A method of obtaining semiconductor chips by cutting a semiconductor wafer in which a plurality of electronic element regions are provided, comprising the steps of:
   (a) forming first and second electronic element regions on a major surface of said semiconductor wafer such that said first and second electronic element regions are isolated from each other across an isolating zone on said major surface, wherein said isolating zone extends in a first direction perpendicular to an alignment direction of said first and second electronic element regions;
   (b) forming N grooves in said isolating zone parallel to said first direction, wherein (N−1) intergroove spaces intervene between said N grooves and N is an integer larger than one; and
   (c) cutting said semiconductor wafer along a cutting line which is set on one of said (N−1) intergroove spaces and extends in said first direction to thereby obtain semiconductor chips each having an electronic element region;
   wherein step (a) comprises the steps of:
      (a−1) forming first and second active regions in said major surface, each of said first and second active regions having at least one electronic element; and (a—2) providing first and second insulating layers which cover said first and second active regions, respectively, to thereby obtain said first and second electronic element regions;

step (b) comprises the steps of:

(b—1) forming an insulating strip layer which extends in said first direction is a middle portion of said isolating zone, whereby a first gap is defined between said first insulating layer and said insulating strip layer, and a second gap is defined between said second insulating layer and said insulating strip layer; and (b—2) forming first and second grooves in said isolating zone such that said first groove is aligned with a first side wall of said insulating strip layer facing said first insulating layer across said first gap, and said second groove is aligned with a second side wall of said insulating strip layer facing said second insulating layer across said second gap, and step (c) comprises the steps of:

(c—1) setting said cutting line on said insulating strip layer; and (C—2) cutting said semiconductor wafer at said cutting line with a mechanical dicing tool.

2. A method of claim 1, wherein step (b) further comprises the step of:

(b—3) forming third and fourth grooves in said isolating zone such that said third groove is aligned with a side wall of said first insulating layer facing said first side wall of said insulating strip layer across said first gap, and said fourth groove is aligned with a side wall of said second insulating layer facing said second side wall of said insulating strip layer across said second gap.

3. A method of claim 2, wherein steps (b—2) and (b—3) in combination comprise the steps of:

(b—4) forming first and second etching-resistant layers on first and second areas of said isolating zone, respectively, in which said first area is located between said first insulating layer and said insulating strip layer on said major surface, and said second area is located between said second insulating layer and said insulating strip layer on said major surface, providing a first gap space between said insulating strip layer and said first etching-resistant layer, providing a second gap space between said insulating strip layer and said second etching-resistant layer, providing a third gap space between said first insulating layer and said first etching-resistant layer, providing a fourth gap space between said second insulating layer and second etching-resistant layer, and (b—5) selectively etching said semiconductor wafer through said first to fourth gap spaces to thereby obtain said first to fourth grooves, respectively.

4. A method claim 3, wherein step (b—5) comprises the steps of:

forming a third insulating layer covering respective regions on said major surface;

forming first and second resist films on first and second portions of said third insulating layer which are located on said first and second insulating layers, respectively;

applying a plasma to respective regions on said major surface so that portions of said third insulating layer not covered with said first and second resist films are etched away and then said first to fourth grooves are formed through selective etching of said semiconductor wafer by said plasma passing through said first to fourth gap spaces, respectively; and removing said first and second resist films from said semiconductor wafer.

5. A method of claim 4, wherein step (b—4) comprises the steps of:

forming a metal layer covering respective regions on said major surface;

heating said semiconductor wafer together with said metal layer to thereby convert first and second portions of said metal layer contacting said semiconductor wafer in said first and second gaps into first and second metal-semiconductor composite layers serving a said first and second etching-resistant layers, respectively; and removing respective portions of said metal layer other than said first and second portions.

6. A method of claim 5, comprising each width of said first to fourth grooves being larger than each width of said first to fourth gap spaces in said first direction, and said first to fourth grooves being first to fourth cavities having openings communicating said first to fourth gap spaces, respectively.

7. A method of claim 6, wherein a half of each width of said first to fourth grooves being smaller than a half of width of said insulating strip layer in said alignment direction.

8. A method of claim 7, comprising etching each depth of said first to fourth grooves to about one micron.

9. A method of claim 8, comprising:

said semiconductor wafer being a silicon wafer, said first and second insulating layers and said insulating strip layer being made of silicon oxide, said third insulating layer being made of silicon nitride, and a material of said metal layer being one of platinum, tungsten and molybdenum.

* * * * *